US012543281B2

(12) United States Patent
Berkley et al.

(10) Patent No.: US 12,543,281 B2
(45) Date of Patent: Feb. 3, 2026

(54) REMOVABLE ADJUSTABLE REMOTE CONTROL

(71) Applicant: Vornado Air, LLC, Andover, KS (US)

(72) Inventors: Shawn Berkley, Wichita, KS (US); Brian Cartwright, Wichita, KS (US); Gregory Pease, Andover, KS (US); Joshua Weed, Wichita, KS (US)

(73) Assignee: Vornado Air, LLC, Andover, KS (US)

( * ) Notice: Subject to any disclaimer, the term of this patent is extended or adjusted under 35 U.S.C. 154(b) by 0 days.

(21) Appl. No.: 18/771,852

(22) Filed: Jul. 12, 2024

(65) Prior Publication Data

US 2025/0024614 A1 Jan. 16, 2025

Related U.S. Application Data

(63) Continuation of application No. 29/887,887, filed on Mar. 24, 2023, now Pat. No. Des. 1,056,859.

(60) Provisional application No. 63/526,933, filed on Jul. 14, 2023, provisional application No. 63/526,409, filed on Jul. 12, 2023.

(51) Int. Cl.
*H05K 5/02* (2006.01)

(52) U.S. Cl.
CPC .................................. *H05K 5/0217* (2013.01)

(58) Field of Classification Search
CPC .............................. G08C 17/02; H05K 5/0217
See application file for complete search history.

(56) References Cited

U.S. PATENT DOCUMENTS

| | | | | |
|---|---|---|---|---|
| D418,837 | S | 1/2000 | Ishii | |
| 6,946,988 | B2 * | 9/2005 | Edwards | G08C 23/04 345/169 |
| D568,510 | S | 5/2008 | Shiu | |
| D592,782 | S | 5/2009 | Hine et al. | |
| D593,489 | S | 6/2009 | Yang | |
| 10,091,854 | B1 | 10/2018 | Brandon, II | |
| D920,971 | S | 6/2021 | Park et al. | |
| D994,622 | S | 8/2023 | Liang et al. | |
| 2005/0115816 | A1 | 6/2005 | Gelfond et al. | |
| 2009/0043217 | A1 | 2/2009 | Hui et al. | |
| 2010/0133906 | A1 * | 6/2010 | McClurkan | H01R 13/665 307/38 |
| 2012/0049790 | A1 | 3/2012 | Wu | |
| 2013/0041617 | A1 | 2/2013 | Pease et al. | |
| 2017/0301230 | A1 | 10/2017 | Liu et al. | |
| 2018/0224881 | A1 * | 8/2018 | Jensen | A63H 33/042 |
| 2020/0020225 | A1 | 1/2020 | Kurioka et al. | |

FOREIGN PATENT DOCUMENTS

| | | | | |
|---|---|---|---|---|
| AU | 2018203731 | A1 | * | 12/2018 |
| CN | 112346362 | A | | 2/2021 |
| CN | 306495454 | | | 4/2021 |
| KR | 20180005064 | | * | 1/2018 |

* cited by examiner

*Primary Examiner* — Yong Hang Jiang
(74) *Attorney, Agent, or Firm* — Avyno Law P.C.

(57) ABSTRACT

A remote control is provided for controlling an electronic device, where the remote control includes a remote housing and a cradle. A strap is also provided for securing the remote control against an object. The remote housing is removably coupled to the cradle in a manner that allows the remote housing to rotate or be repositioned within the cradle such that the remote housing can remain in an upright position regardless of positioning of the remote control on the object.

12 Claims, 8 Drawing Sheets

REMOVABLE ADJUSTABLE REMOTE CONTROL

CROSS REFERENCE TO RELATED APPLICATIONS

The application claims priority to U.S. Provisional Application Ser. No. 63/526,933 filed on Jul. 14, 2023, titled Removable Adjustable Remote Control and to U.S. Provisional Application Ser. No. 63/526,409 filed on Jul. 12, 2023, titled Pivoting Fan, both applications of which are incorporated into this application in its entirety.

FIELD OF THE INVENTION

The invention relates to a remote, and in particular, a remote that can be secured to various shaped objects, easily removed and easily reconfigured at various orientations.

BACKGROUND OF THE INVENTION

When exercising, the body gets increasingly hot during the duration of a workout. Fans are often desired by individuals exercising indoors to help cool down the body during a workout. However, once a workout commences, especially when working out on equipment, like treadmills, bikes, ellipticals, etc., it is difficult to adjust the direction or speed of a fan directed toward the workout-equipment. Remotes have become more popular for use in connection with fans. However, remotes are easily lost and often times hard to engage and control, especially when working out.

A need exists for a remote that is easy to use while on exercise equipment to control electronic devices, such as fans, or even radios and televisions.

SUMMARY

The present invention relates to a remote control for controlling an electronic device, the remote control comprising a remote housing removably coupled to a cradle having a strap, where the strap removably secures the cradle and the remote housing to an object. The remote housing is removably coupled to the cradle in a manner that allows the remote housing to rotate or be repositioned within the cradle such that the remote housing can remain in an upright position regardless of positioning of the remote control on the object. In one example, the remote control further magnets for removably attaching the remote housing to the cradle, or optionally, the cradle includes ferromagnetic material and the remote housing includes a magnet for removably securing the remote housing to the cradle.

In one example, the remote control of the present invention comprises a remote housing and a cradle. The remote housing has a first magnet positioned within the remote housing and further includes buttons for controlling certain operations of an electronic device. In this example, the remote control may be circular in shape. The cradle has a second magnet or includes ferromagnetic material for attracting the first magnet of the remote housing. The cradle further includes a recess of the same circular shape as the remote housing for receiving and removably securing the remote housing within the recess of the cradle, such that the remote housing can be rotated or repositioned within the cradle to change the orientation of the buttons relative to the housing.

In another example, the remote control of the present invention comprises a remote housing having buttons for controlling the speed of a fan and a cradle having a recess for receiving the remote housing and removably securing the remote housing within the recess of the cradle such that the remote housing can be rotated or repositioned within the cradle to change the orientation of the buttons relative to the housing. The remote control further includes a strap secured to the cradle for attaching the remote housing to bars on exercise equipment.

In all examples, the remote control may include a strap for securing the remote control to an object, may use magnets or a combination of a magnet and ferromagnetic material to removably secure the remote housing to the cradle, or may use friction fit to removably secure the remote housing to the cradle. The remote housing and cradle may each include either at least one indent or at least one protrusion for aligning the remote housing within the recess of the cradle at predetermined positions by aligning the indents with the protrusions. Alternatively, the remote housing and cradle may each include either at least two indents or at least two protrusions for aligning the remote housing within the recess of the cradle at predetermined positions by aligning the indents with the protrusions.

In another example, the cradle of the remote control further includes at least one protrusion for aligning with at least one indentation in the remote housing. In another example, the cradle of the housing includes at least one pair of opposingly aligned protrusions and the remote housing includes at least two indentations that are perpendicularly aligned with one another for allowing the remote housing to be positioned in the cradle at 0, 90, 180 and 270 degrees. In yet another example, the remote housing may be freely rotatable in the cradle of the housing, secured against the cradle through only magnetic attraction between the remote housing and the cradle.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

DESCRIPTION OF THE FIGURES

The invention may be better understood by referring to the following figures. The components in the figures are not necessarily to scale, emphasis instead being placed upon illustrating the principles of the invention.

DESCRIPTION OF THE INVENTION

Figure 8:
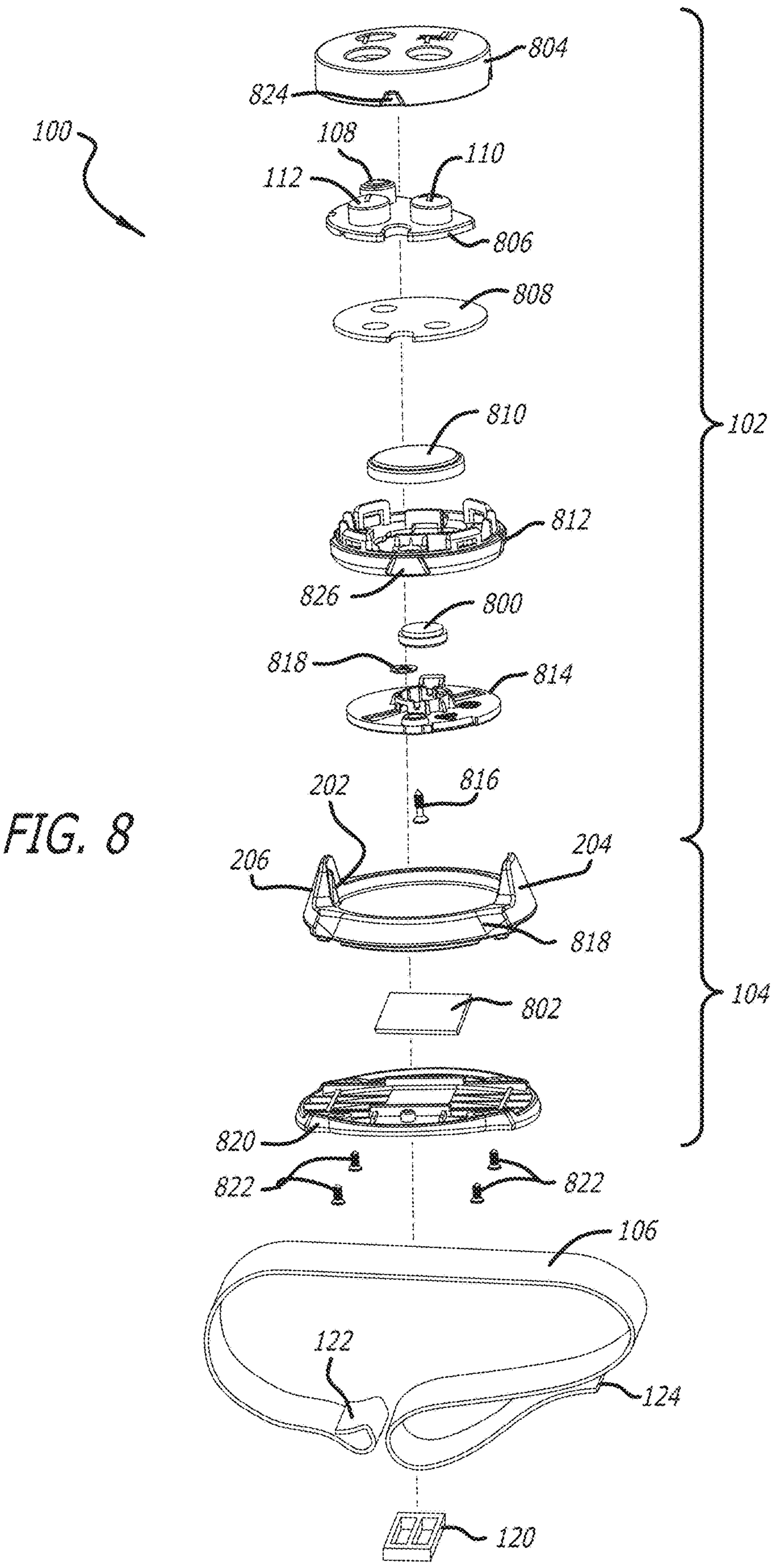
FIG. 8 is an exploded view of the remote control of FIG. 1.
Figure 12:
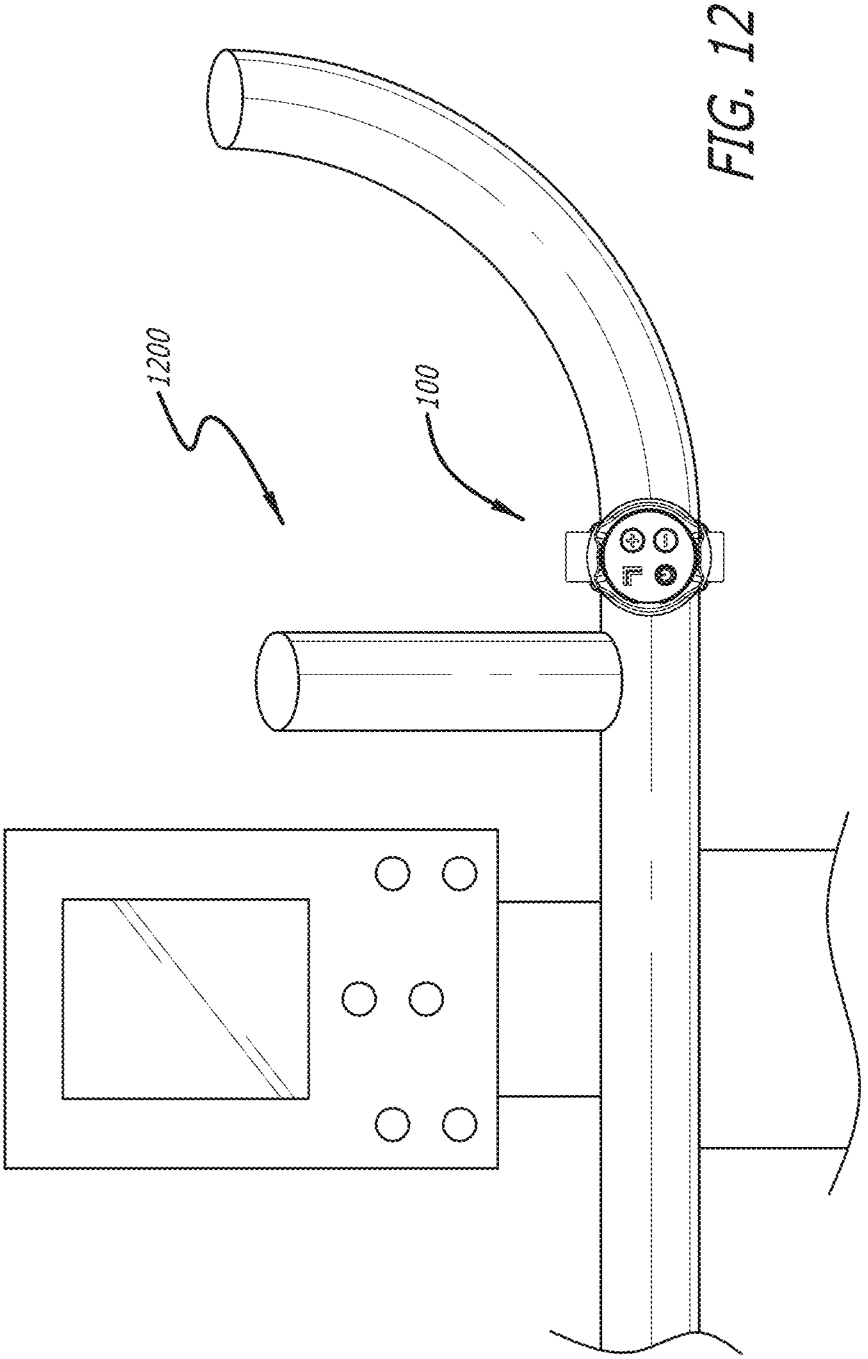
FIG. 12 is one illustration of the remote control of FIG. 1 strapped to the bar of workout equipment.

The current invention relates to a remote 100, also referred to as a remote control. While the design of a remote control 100 can be used to control any type of electronic device, for purposes of illustration, the remote described in the present invention is designed for use with a fan (not shown). As will be illustrated below, the remote control 100 includes a remote housing 102 that is attached to a cradle 104 via magnets 800, 802 (FIG. 8). The remote control 100 uses RF, Bluetooth and/or WiFi to communicate with a fan (not shown). The remote control 100 includes a strap or straps 106 attached to the cradle 104. The strap(s) 106 are flexible and, as shown in FIG. 12, can attach to a variety of different shaped and oriented objects, including bars of workout equipment, like an elliptical, stair master, or treadmill. Given the design, the remote control 100 can attach to bars of any directional orientation, while still allowing the remote house to remain properly aligned, in an upright position, for access by the user. Optionally, remote housing 102 may also be able to attach directly to ferromagnetic components of workout equipment or other objects (e.g., metal water bottle or metal water bottle holder) without requiring the strap(s) 106.

As further illustrated, remote housing 102, being magnetically attached to the cradle 104, can be oriented in the cradle 104 in different directions. In the illustrated design, remote housing 102 can be oriented securely at 0, 90, 180 or 270 degrees in the cradle 104. The remote control 100 may then control a fan on the floor, on a shelf or mounted from the ceiling that blows on a person working out. In one example, the remote control 100 is designed to work with a vertically orientated blower fan designed for fitness use. For example, the fan may pivot up and down to aim it on a person to cover the full body of a person as they workout. In another example, the fan may oscillate or include other features that may be controlled by the remote.

In this disclosure, all “aspects,” “examples,” “embodiments,” and “implementations” described are considered to be non-limiting and non-exclusive. Accordingly, the fact that a specific “aspect,” “example,” “embodiment,” or “implementation” is explicitly described herein does not exclude other “aspects,” “examples,” “embodiments,” and “implementations” from the scope of the present disclosure even if not explicitly described. In this disclosure, the terms “aspect,” “example,” “embodiment,” and “implementation” are used interchangeably, i.e., are considered to have interchangeable meanings.

In this application, the term “substantially,” “approximately,” or “about,” when modifying a specified numerical value, may be taken to encompass a range of values that include +/−10% of such numerical value. Further, such as “communicate,” and “in . . . communication with,” or “interfaces” or “interfaces with” (for example, a first component “communicates with” or “is in communication with” a second component) are used herein to indicate a structural, functional, mechanical, electrical, signal, optical, magnetic, electromagnetic, ionic or fluidic relationship between two or more components or elements. As such, the fact that one component is said to communicate or interface with a second component is not intended to exclude the possibility that additional components may be present between, and/or operatively associated or engaged with, the first and second components.

Figure 3:
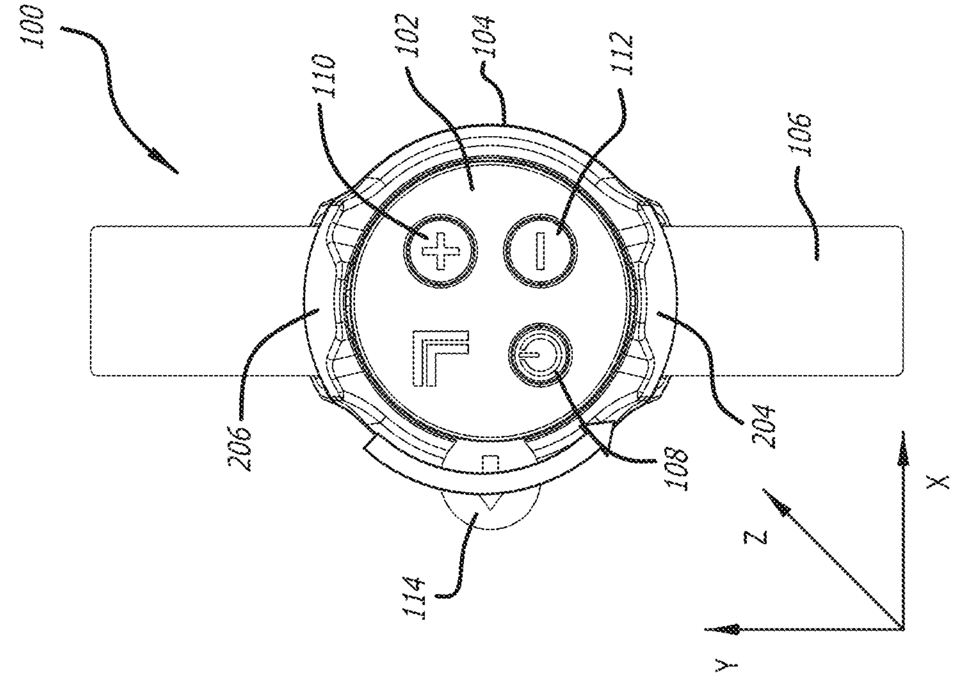
FIG. 3 is a front view of the remote control of FIG. 1 showing the remote housing oriented in a first position.

For purposes of reference and description, the remote is considered to have horizontal (x-axis) and vertical device axis (y-axis) and a z-axis, as shown in FIG. 3 along which the components of the remote are positioned relative to each other. Terms such as “axial” and “axially” are assumed to refer to the respective axis or any direction or axis parallel to the device axis, unless indicated otherwise or the context dictates otherwise. For convenience, movement relative to a device axis may alternatively encompass movement relative to an axis that is parallel to the device axis that is specifically illustrated in FIG. 3, unless the context dictates otherwise. Thus, linear translation “along the device axis z” is not limited to translation directly on (coincident with) the device axis, but also encompasses translation parallel to the device axis z, depending on the context. Similarly, rotation “about the device axis y” also encompasses rotation about an axis that is parallel to the device axis y, depending on the context.

As shown in FIGS. 1-8, the remote or remote control 100 of the present invention includes a remote housing 102 that is removably attached to a cradle 104 via magnets 800, 802 (FIG. 8). The remote control 100 further includes electronic circuitry including a transmitter and/or transceiver for communicating with the electronic device for which it controls. As stated previously, the remote control 100 may communicate with an electronic device, such as a fan, radio, TV or the like using RF, Bluetooth, WiFi and/or other communication protocols. As will be described further below in connection with FIG. 8. In the present example, the remote control 100 includes a PCB with RF or Bluetooth communication capabilities. The remote control 100 also includes a battery, which could be reusable or rechargeable, for powering the remote control 100.

Figure 1:
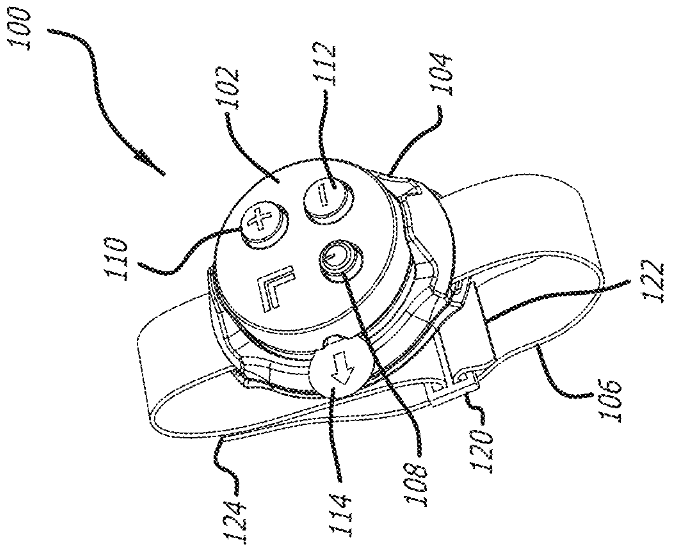
FIG. 1 is a front perspective view of the top of one example of an implementation of a remote control of the present invention.

FIG. 1 is a front perspective view of the top of one example of an implementation of a remote control 100 of the present invention. As shown, remote control 100 includes a remote housing 102 and cradle 104, having a strap 106 attached to the cradle. The remote control 100 includes at least three buttons for controlling the operation of an electronic device, such as a fan. In the illustrated example, remote control 100 includes an on/off button 108, an increase button 110 and a decrease button 112 all positioned on the front face remote control 100. Strap 106 includes a first end 122 and a second end 124 which may be attached to one another using a buckle 120. Also shown in FIG. 1 but not present during operation of the remote control 100 is tab 114 for separating the battery from the electrical contacts until use.

In this example, the remote control 100 is designed for communication with a fan. Accordingly, the on/off button 108 turns the fan on and off and the increase button 110 and decrease button 112 control the speed of the fan. Optionally, although not shown, the remote could include buttons to allow for a fan to oscillate, adjust the angle of the fan or control other functions of the fan, e.g., to stop and start the oscillation. If used to control other electric devices, the remote control 100 may include buttons for controlling any function of an electronic device, for example, on/off, volume or channel controls. In addition to or in place of buttons 110, 112, other tactile or haptic controls, such as wheels, switches or known control mechanism can also be used on the remote control 100 to control the various functions of the electronic device to which it communicates.

Figure 2:
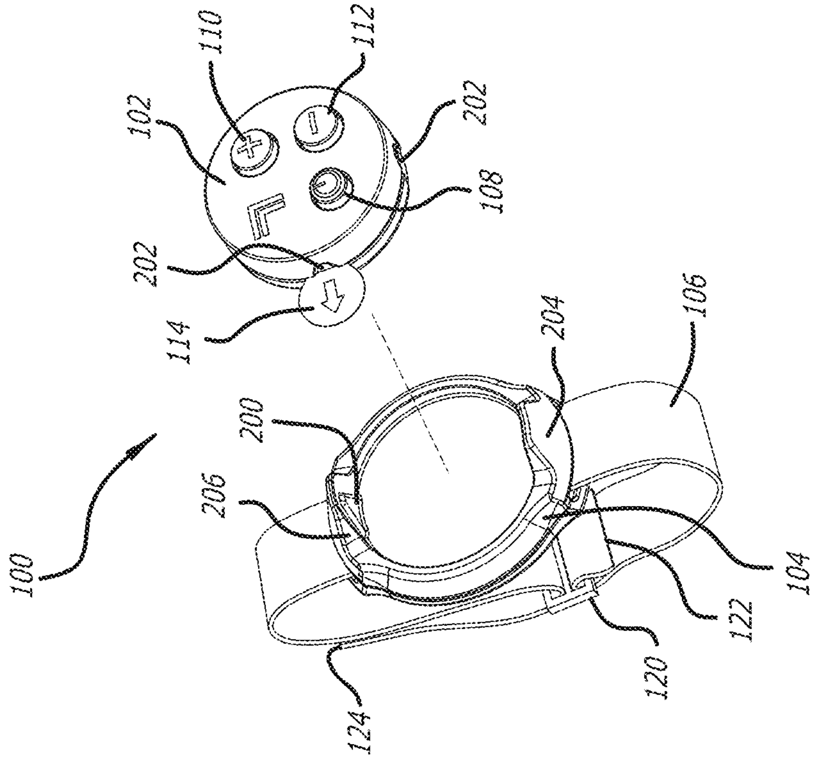
FIG. 2 is a front perspective view of the top of the remote control of FIG. 1 showing the remote housing removed from the cradle.

FIG. 2 is a front perspective view of the top of the remote control 100 of FIG. 1 showing the remote housing 102 removed from the cradle 104. As will be described and illustrated further below, remote housing 102 is removably secured against the cradle 104 via magnets 800, 802 (FIG. 8). The shape of remote housing 102 is such that it allows the remote housing 102 to rotate within the cradle 104 when mounted on the cradle 104.

Figure 7:
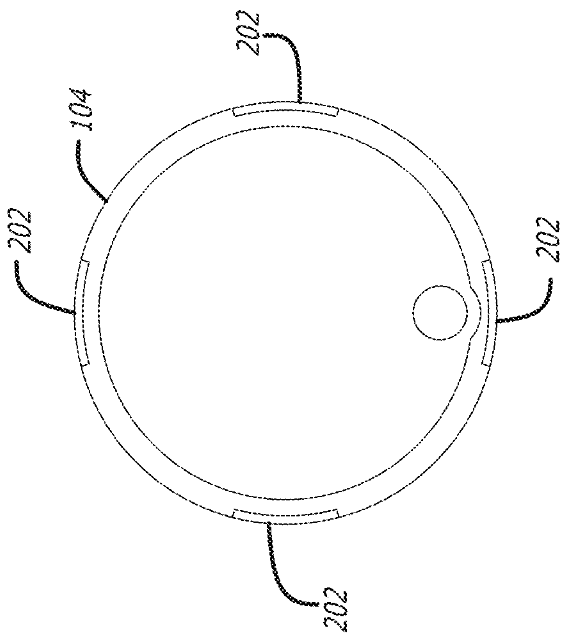
FIG. 7 is a bottom view of the remote housing of the remote control of FIG. 1.

In this example, both remote housing 102 and the cradle 104 are circular in shape. Cradle 104 is larger in diameter than the remote housing 102 and includes a recess for receiving the remote housing 102. Cradle 104 may also include at least one raised wall 204, or as illustrated two raised walls 204, 206, or even four walls. Each raised wall 204, 206 may include a protrusion 200 on the interior of the raised wall 204, 206 for aligning with an indent (or multiple indents) 202 the side of the remote housing 102. The remote housing may have at least one, two or even four (as illustrated in FIG. 7) indents 202. By using at least two opposing indents 202 positioned perpendicularly to one another on the side of the remote housing 102, and two opposing raised side walls 204, 206 with protrusions 200, the remote housing 102 can be oriented at 0, 90, 180 or 270 degrees in the cradle.

Optionally, the remote housing may be freely oriented in the cradle without any indents 202; however, the indents 202 help maintain the remote housing 102 against the cradle 104 and prevent undesired movement between the remote housing 102 and the cradle 104. Additionally, and without departing from the scope of the invention, the cradle 104 could include the indent(s) 202 and the remote housing 104 could include the protrusion(s) 200. Lastly, remote housing 102 and cradle 104 may also be made of other shapes without departing from the scope of the invention. For example, remote housing 102 and the cradle 104 may be square, which would still permit the remote housing 102 to be oriented at 0, 90, 180 or 270 degrees in the cradle 104 by rotating the remote housing 102 either clockwise or counterclockwise within the cradle 104.

Figure 4:
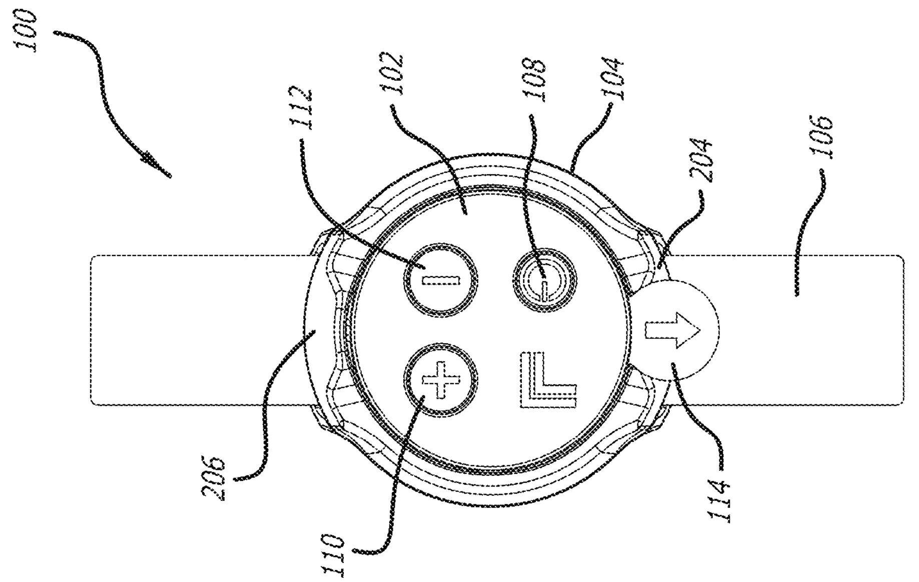
FIG. 4 is a front view of the remote control of FIG. 1 showing the remote housing oriented in a second position.

FIGS. 3 and 4 illustrate remote housing 102 rotated within the cradle 104. FIG. 3 is a front view of remote control 100 showing the remote housing 104 oriented in a first position, while FIG. 4 is a front view of the remote control 100 showing the remote housing 104 oriented in a second position. Here, the first position is oriented at 0 degrees, while the second position is oriented 90 degrees counterclockwise from the first position. While not shown, in this example, the remote housing 104 may also be oriented in a third position at 180 degrees and in the fourth position at 270 degrees. Such movement between the remote housing 102 and the cradle 104 can be achieved by rotating the remote housing 102 in either the clockwise or counterclockwise direction. If the remote housing 104 is freely rotatable in the cradle 104, the remote housing 104, when using a circle design, can be positioned at any angle from 0 to 360 degrees. Those skilled in the art will recognize that other shapes of the remote housing 102 and cradle 104, with or without accounting for the position and number of indents 200 and protrusions 202, will result in differing angles of rotation of the remote housing 102 within the cradle 104.

Figure 5:
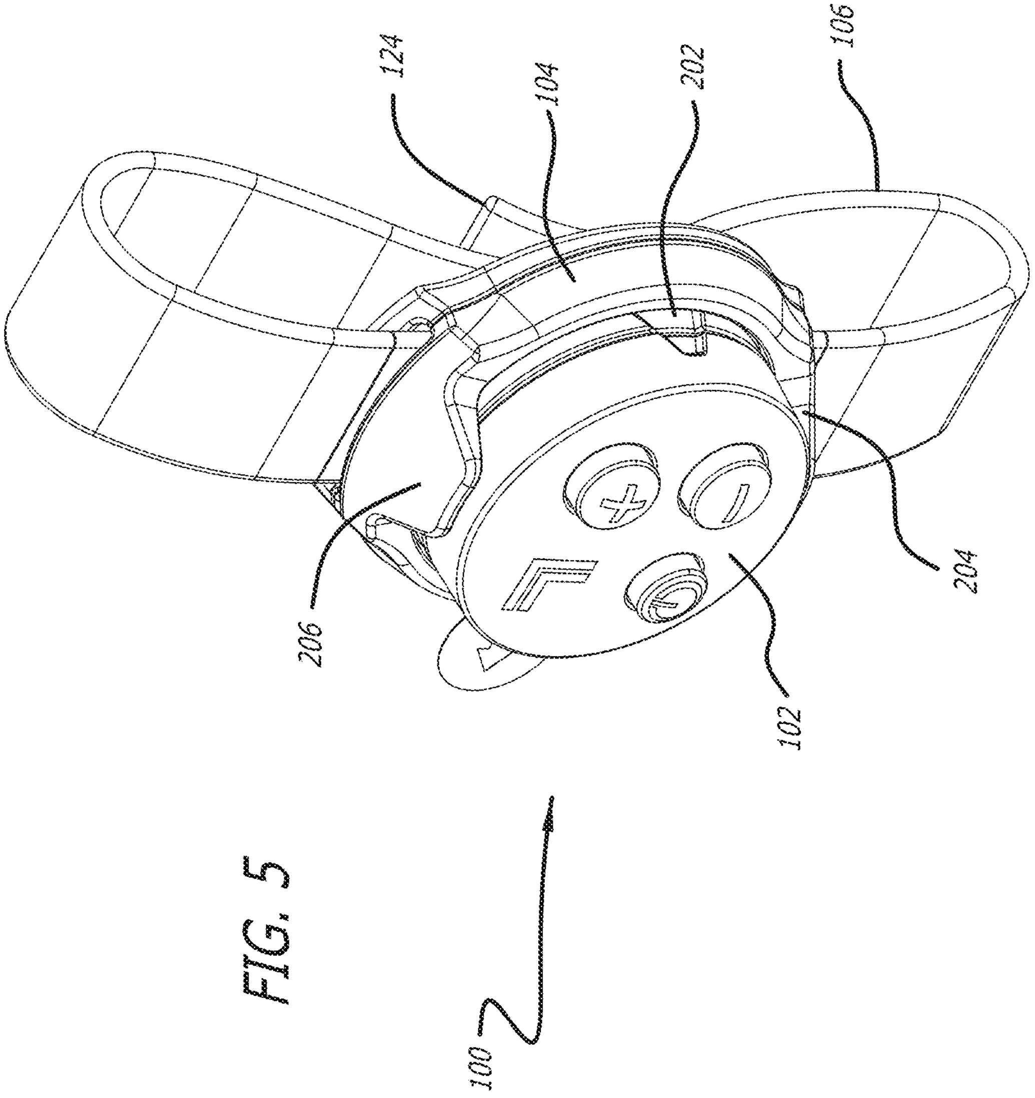
FIG. 5 is a top front perspective view of the remote control of FIG. 1 showing the remote housing oriented in a first position.
Figure 6:
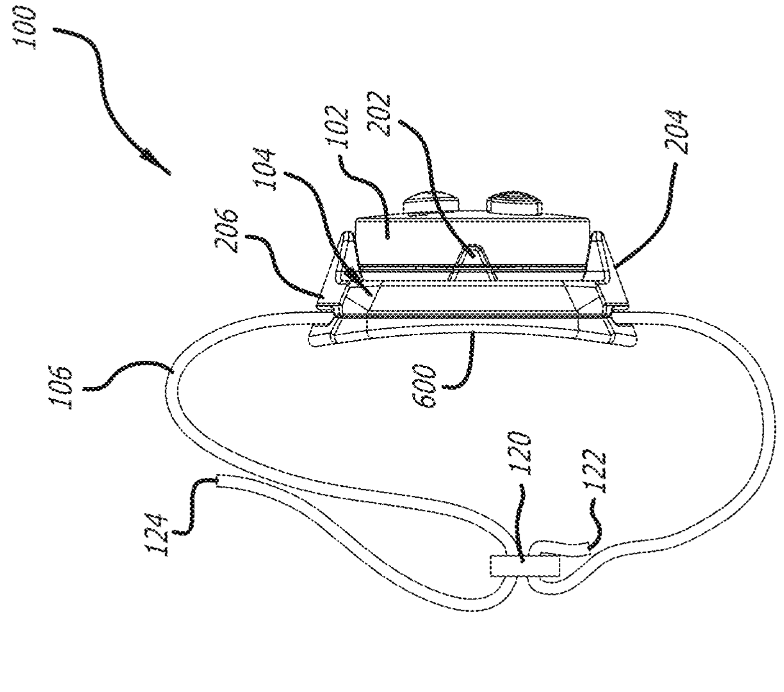
FIG. 6 is a side view of the right side of the remote control of FIG. 1.

Turning now to FIGS. 5 and 6, FIG. 5 is a top front perspective view of the remote control 100, and FIG. 6 is a side view showing the right side of the remote control 100 of FIG. 1. FIGS. 5 and 6 clearly show the remote housing 102 positioned within the front recess of the cradle 104. FIG.

5 also shows openings on the side of the cradle 104 for receiving the strap 106. Raised walls 206 of the cradle 104 are also shown, as well as the indent 202 on the side of the remote housing for aligning with the protrusion(s) 200 on the inside of the raised wall(s) 206 of the cradle 104.

FIG. 7 is a bottom view of remote housing 102 of the remote control 100. In this example, indents 202 are shown positioned at 0, 90, 180 and 270 degrees about the circumference of the remote housing 102. All four indents 202 would be required to achieve 360 degrees of rotation of the remote housing 102 at 90° increments if the raised walls 204, 206 only include one protrusion between them. However, if both raised walls 204, 206 each include a protrusion, only vertically positioned indents at 0° and 90° would be required to achieve rotation of the remote housing 102 in the cradle 106 at 0, 90, 180 and 270 degrees.

Again, free rotation of the remote housing 102 within cradle 106 can be achieved through magnetic attraction only, which would allow for rotation from 0 to 360° of the remote housing 102 within the cradle 104. However, the use of an alignment mechanism such as the indents and protrusions taught by the invention, providing more secure fit between the remote housing 102 and cradle 104 and further prevents any undesired movement between the remote housing 102 and cradle 104. Lastly while the indents are taught on the remote housing 102 and protrusions on the cradle 104, those skilled in the art will recognize that the cradle 104 may include indentations and the remote housing 102 may include the protrusions without departing from the scope of the invention.

FIG. 8 is an exploded view of remote control 100. As show in FIG. 8, both the remote housing 102 and cradle 104 are comprised of multiple components. The remote housing 102 includes a top cover 804 having openings for receiving buttons 108, 110 and 112 position on a button plate 806. A printed circuit board ("PCB") 808 is also included within the remote housing 102 and is in communication with the buttons 108, 110 and 112 and battery 810 for operation of the remote control 100. The PCB 808 further includes communications hardware and/or software to provide RF, Bluetooth and/or WiFi communication capabilities, which will allow the remote control 100 to communicate with, and control the operation of, the electronic device to which the remote control 100 is paired or is designed to operate.

A lower sleeve 812 is also provided for housing the battery 810, the PCB and the button plate 806 within the remote housing 102 between the top cover 804 and the lower sleeve 812. The lower sleeve 812 may attach to the top cover 804 via friction fit components, bayonets style fittings or other known mechanisms for removably securing two components. Additionally, a base 814 is also provided for housing a magnet 800. The base 814 is designed to be secured to the bottom of the lower sleeve 812, which in this example is secured by a washer 818 and screw 816. To the lower sleeve 812.

In this example, it is shown that the intend(s) 202 for mating with the protrusion(s) 200 on the cradle 104 are span across the sides of both the top cover 804 and the lower sleeve 812. When assembled, a lower portion 826 of the indent 202 on the side of the lower sleeve 812 is aligned with a top portion 824 of the indent 202 on the side of the top cover 804.

The cradle 104 is comprised of a receiving member 818 having at least one, but possibly more, such as two, three or four, raised walls 204, 206 having at least one protrusion 202 positioned on at least one of the raised walls 204, 206.

Alternatively, indents on the interior side of the raised wall(s) 204, 206 may be used instead of protrusion(s) 202.

Cradle 104 also includes a lower plate 820 for securing to the receiving member 818 via screws 822 or other known attachment mechanisms. A magnet 802 is positioned between the receiving member 818 and the lower plate 820. Further, the strap 106 may also be placed through the cradle 104 underneath the magnet by strap openings formed on the sides of the cradle 104 when the receiving member 818 and lower plate 820 are joined together. Such strap openings are shown in FIGS. 5, 6, 10 and 11.

The magnets 800, 802 removably secure the remote housing 102 to the cradle 104. The magnets 800, 802 can be two opposing pole magnets or one magnet and one ferromagnetic material, e.g., a steel plate, positioned in the cradle and/or housing respectively. Optionally, in another example, remote housing 104 could be removably secured to the cradle 104 via a friction fit, bayonet fit, or the like that also allows for the rotation or repositioning of the remote housing 104 within the cradle 104.

While the present invention has the battery 810 included within the remote housing 102, those skilled in the art will also recognize that the battery may be positioned within the cradle 104 and electrical contacts such as plates, rings, pogo pins or the like may be used to provide power to the remote housing 102 positioned in the cradle 104 should the battery 810 be positioned in the cradle 104.

Strap 106 is also illustrated, having a first end, second end and buckle 120. The first end 122 can be looped through a first opening of the buckle 120, folded over on itself and sewn together to secure the first end 122 of the strap 106 to one side of the buckle. The second strap end 124 can also be looped through a second opening in the buckle 120 and secured to itself as further described in connection with FIG. 9, which is a top view of a strap 106.

Strap 106 is a flexible strap, which can be seen in FIGS. 1-6 and 7-12. The strap 106 may be attached to the cradle 104, as described above or through other known mechanisms, including, but not limited to, channels or openings for receiving one or more ends of the strap (e.g. using two straps and securing one end of each strap to one side of the cradle 104, similar to a watchband). Since the strap 106 is flexible, the strap 106 can attach to a variety of different shaped, sized and oriented objects, including bars of workout equipment, like an elliptical, stair master, treadmill, bike, etc. Strap 106 may be secured to itself at various positions to accommodate different sized bars and objects through known securing mechanisms, including Velcro®, buckles, magnets, etc.

Figure 9:
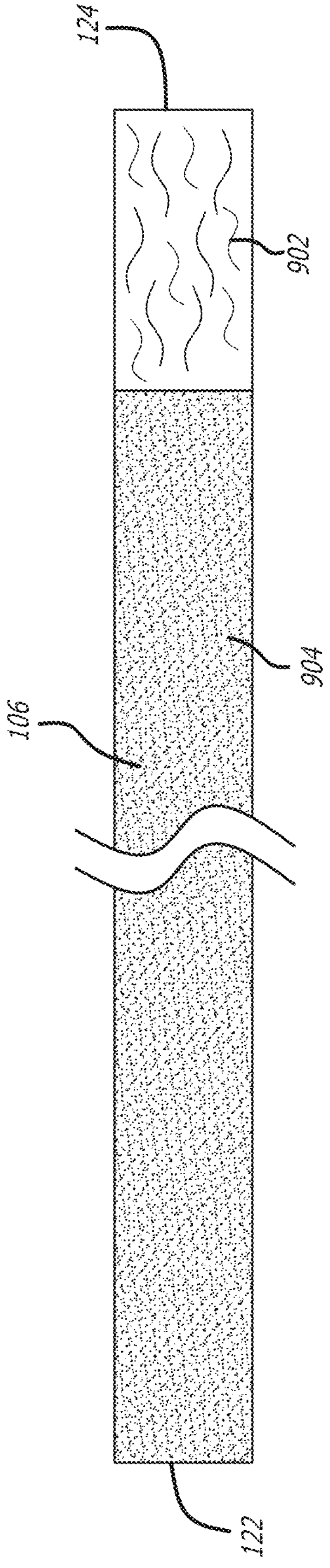
FIG. 9 is a top view of a strap of the remote control of FIG. 1.

In this example, the first end 122 of strap 106 may be secured to a first opening of a buckle 120 and the second end 124 of strap 106 is then able to loop through a second opening in the buckle 120. The second end 124 of strap 106 may then be folded back over and secured to itself at various positions. To accomplish this, the strap 106 includes Velcro®. As shown in FIG. 9, the majority of the strap 106 (at least on one side of the strap 106) is made of a fabric pile 904 and a portion of the strap 106 near the second end 124 includes hooks 902, such that the second end 124 of strap 106 having hooks 902 is able to removably secure itself to the fabric pile 904 along the remaining portion of the strap 106. Those skilled in the art will recognize that other methods of removably securing the ends 122 and 124 of the strap 106 together may be used without departing from the scope of the invention. Optionally, the buckle 120 could also be omitted at the first end 122 of the strap 106 could be fastened directly to the second end 124 of the strap 106, using, for example, Velcro®.

Figure 11:
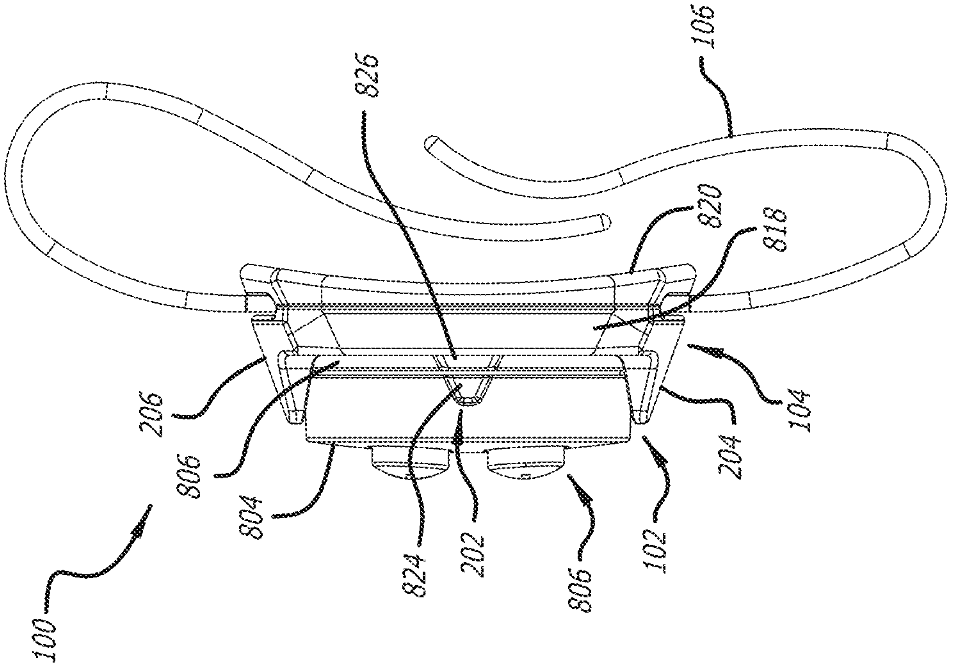
FIG. 11 is a side view of the left side of the remote control of FIG. 10.
Figure 10:
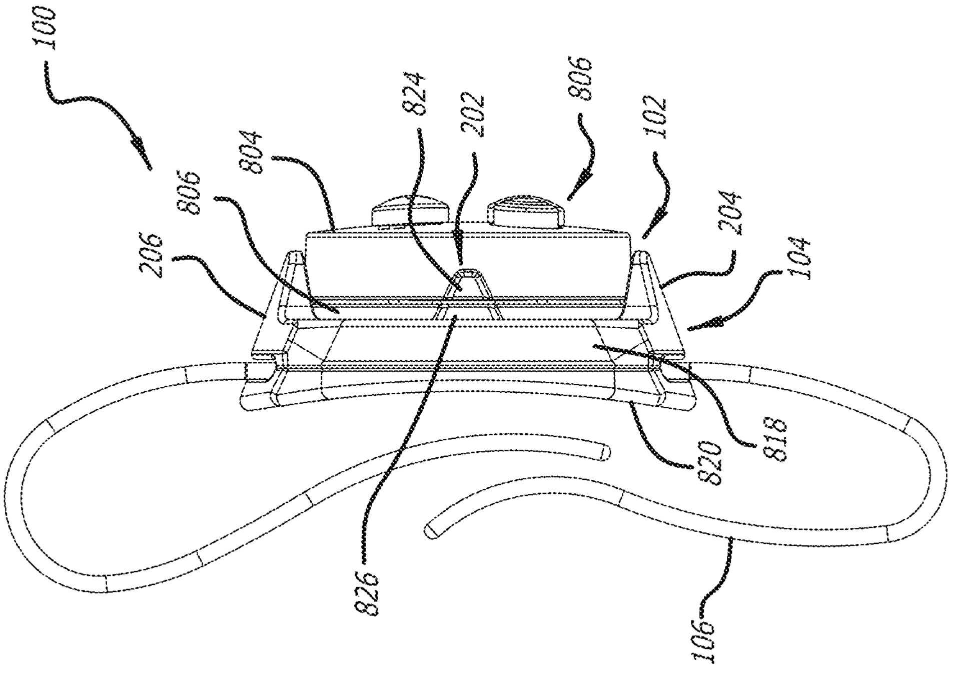
FIG. 10 is a side view of the right side of the remote control of FIG. 10.

Regarding FIGS. 10 and 11, FIG. 10 is a side view of the right side of the remote control 100 of FIG. 10, and FIG. 11 is a side view of the left side of the remote control 100 of FIG. 10. FIGS. 10 and 11 best illustrate the inclusion of indents 202 on both sides of the remote housing 104; however, as discussed above, when two opposing raised walls 206 are included in the cradle 104 and each opposing raised wall 206 includes a protrusion 200, only two vertically perpendicularly positioned indents 202 (positioned at 0° and 90° relative to one another) on the side of the remote housing 104 are required to allow for 360° movement of the remote housing 104 relative to the cradle 104 at 0, 90, 180 or 270 degrees.

FIG. 12 is an example illustration of the remote control 100 strapped to the bar of workout equipment 1200. In operation, should the user desire to strap the remote control 100 to a bar that is perpendicular from the orientation shown in FIG. 12, the user could simply remove the remote housing 102 from the cradle 104 and reposition the remote housing 102 into the cradle 104 by turning it 90 degrees counter clockwise to maintain the orientation of the buttons 108, 110 and 112 on the remote control 100 regardless of which bar on the workout equipment the remote control 100 is secured.

Further, if the remote housing 102 includes a magnet 800 rather than ferromagnetic metal, the remote housing 104 could attach directly to ferromagnetic components of the workout equipment or other components (maybe even a metal water bottle in a holder) without requiring the strap 106. This would allow remote housing 104 to be affixed directly to the workout equipment in any orientation.

While the invention described a remote for controlling a fan, those skilled in the art will recognize that the remote could be designed for use with other electronic devices. Other devices, apparatus, systems, methods, features and advantages of the invention will be or will become apparent to one with skill in the art upon examination of the following figures and detailed description. It is intended that all such additional systems, methods, features and advantages be included within this description and be within the scope of the invention.

Other features may also be optionally implemented into the remote control described herein, without departing from the scope of the invention. For example, the remote control may include WiFi access, Bluetooth, RF and other hardware and software to facilitate communications between a fan or other electronic devices and an internal or external network. Bluetooth, WiFi, radio and or other wired or wireless communications may be established between the portable electronic devices and remote control to increase functionality by placing the remote in signal communication with the portable electronic device(s). For example, speakers or other accessories may also be accessible through communication between the remote control, fan or other electronic device (s).

It will be understood that the component parts of the system taught herein may further be in signal communication with one another. The term "in signal communication" as used herein means that two or more systems, devices, components, modules, or sub-modules are capable of communicating with each other via signals that travel over some type of signal path. The signals may be communication, power, data, or energy signals, which may communicate information, power, or energy from a first system, device, component, module, or sub-module to a second system, device, component, module, or sub-module along a signal path between the first and second system, device, component, module, or sub-module. The signal paths may include physical, electrical, magnetic, electromagnetic, electrochemical, optical, wired, or wireless connections. The signal paths may also include additional systems, devices, components, modules, or sub-modules between the first and second system, device, component, module, or sub-module.

The foregoing description of an implementation has been presented for purposes of illustration and description. It is not exhaustive and does not limit the claimed inventions to the precise form disclosed. Modifications and variations are possible in light of the above description or may be acquired from practicing the invention. The claims and their equivalents define the scope of the invention.

We claim:

1. A remote control for controlling an electronic device, the remote control comprising:

a remote housing having a first magnet positioned within the remote housing, the remote housing further includes buttons for controlling certain operations of an electronic devices, the remote control being circular in shape; and a cradle having a second magnet or ferromagnetic material for attracting the first magnet of the remote housing, the cradle further including a recess of the same circular shape as the remote housing for receiving and removably securing the remote housing within the recess of the cradle, such that the remote housing can be rotated or repositioned within the cradle to change the orientation of the buttons relative to the housing, where the cradle includes at least two protrusions aligned in opposing relationship to one another for aligning with at least one indent in the remote housing and the remote housing includes at least one pair of indents that are perpendicularly aligned from one another to allow the remote housing to be positioned in the cradle at 0, 90, 180 and 270 degrees by rotating the remote housing within the cradle such that the at least one pair of indents align with at least one of the at least two protrusions of the cradle.

2. The remote control of claim 1 further including a strap secured to the cradle for securing the remote control against an object.

3. A remote control for controlling an electronic device, the remote control comprising:

a remote housing having buttons for controlling the speed of a fan; and a cradle having a recess for receiving the remote housing and removably securing the remote housing within the recess of the cradle such that the remote housing can be rotated or repositioned within the cradle to change the orientation of the buttons relative to the housing;

a strap secured to the cradle for attaching the remote housing to bars on exercise equipment; and where the remote housing and cradle each include either at least two indents or at least two protrusions for aligning the remote housing within the recess of the cradle at predetermined positions by aligning at least one of the at least two indents with at least one of the at least two protrusions and where the at least two indents are aligned in opposing relationship to one another for aligning with at least one of the at least two protrusions and where the at least two protrusions are perpendicularly aligned from one another to allow the remote housing to be positioned in the cradle at 0, 90, 180 and 270 degrees by rotating the remote housing within the cradle such that at least one of the at least two indentations align with at least one of the at least two protrusions.

4. The remote control of claim 3 where the remote housing is removably secured to the cradle using magnets or a magnet and ferromagnetic material.

5. The remote control of claim 3 where the remote housing is removably secured to the cradle using a friction fit.

6. The remote control of claim 3 where the cradle includes the at least two indents for aligning the remote housing within the recess of the cradle at predetermined positions.

7. The remote control of claim 3 where the remote housing includes the at least two indents for aligning the remote housing within the recess of the cradle at predetermined positions.

8. A remote control for controlling an electronic device, the remote control comprising a remote housing removably coupled to a cradle having a strap attached thereto for securing the remote control to an object, and where the remote housing and cradle each include either at least two indents or at least two protrusions for aligning the remote housing within the recess of the cradle at predetermined positions by aligning at least one of the at least two indents with at least one of the at least two protrusions and where the at least two protrusions are aligned on either the remote housing or cradle in opposing relationship to one another for aligning with at least one of the at least two indents and where the at least two indents are perpendicularly aligned from one another on either the remote housing or cradle to allow the remote housing to be positioned in the cradle at 0, 90, 180 and 270 degrees by rotating the remote housing within the cradle such that at least one of the at least two indents align with at least one of the at least two protrusions.

9. The remote control of claim 8 where the cradle and strap each include magnets for removably attaching the remote housing to the cradle.

10. The remote control of claim 8 where the cradle includes ferromagnetic material, and the remote housing includes a magnet for removably securing the remote housing to the cradle.

11. The remote control of claim 8 where the cradle includes the at least two protrusions for aligning with the at least two indents in the remote housing.

12. The remote control of claim 8 where the remote housing includes the at least two protrusions for aligning with the at least two indents in the cradle.

* * * * *